United States Patent
Zhang et al.

(10) Patent No.: US 10,560,080 B1
(45) Date of Patent: Feb. 11, 2020

(54) DUTY CYCLE CORRECTION

(71) Applicant: NXP B.V., Eindhoven (NL)

(72) Inventors: Xu Zhang, Chandler, AZ (US); Siamak Delshadpour, Phoenix, AZ (US); Ahmad Yazdi, Chandler, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/183,698

(22) Filed: Nov. 7, 2018

(51) Int. Cl.
*H03K 5/156* (2006.01)

(52) U.S. Cl.
CPC .................................. *H03K 5/1565* (2013.01)

(58) Field of Classification Search
None
See application file for complete search history.

(56) References Cited

U.S. PATENT DOCUMENTS

| | | | | |
|---|---|---|---|---|
| 6,369,626 | B1 * | 4/2002 | Donnelly | H03K 5/1565 327/157 |
| 2006/0284659 | A1 * | 12/2006 | Tambouris | H03K 5/1565 327/175 |
| 2007/0159224 | A1 * | 7/2007 | Dwarka | H03K 5/1565 327/175 |

OTHER PUBLICATIONS

Min Y. et al. "A 0.31-1 GHz Fast-Corrected Duty-Cycle Corrector With Successive Approximation Register for DDR DRAM Applications", IEEE Transactions on Very Large Scale Integration (VLSI) Systems, vol. 20, No. 8, pp. 1524-1528 (Aug. 2012).
Lin, T. et al. "A Synchronous 50% Duty-Cycle Clock Generator in 0.35-um CMOS", IEEE Transactions on Very Large Scale Integration (VLSI) Systems, vol. 19, No. 4, pp. 585-591 (2011).
Gu, J. et al. "All-Digital Wide Range Precharge Logic 50% Duty Cycle Corrector", IEEE Transactions on Very Large Scale Integration (VLSI) Systems, vol. 20, No. 4, pp. 760-764 (2012).

* cited by examiner

*Primary Examiner* — Cassandra F Cox
(74) *Attorney, Agent, or Firm* — Rajeev Madnawat

(57) ABSTRACT

A duty cycle correction circuit is disclosed. The duty cycle correction circuit includes an input stage, an output stage and a feedback component including a feedback amplifier and a low pass filter. The feedback component compares and adjusts the duty cycle of a signal from an input stage to a target value via a control voltage. The input stage reduces the rise and fall times of received signal to increase the duty cycle sensitivity to a control voltage from the feedback component. The output of the output stage is coupled to the input of the feedback component and the output stage amplifiers the duty cycle adjusted signal processed by both input stage and feedback component.

14 Claims, 3 Drawing Sheets

DUTY CYCLE CORRECTION

BACKGROUND

Duty cycle is measured by dividing the rising part of a signal cycle by the full length of the signal cycle. The duty cycle of a signal may get distorted due to ground shift or noise during the communication. If the absolute average duty cycle distortion is greater than a threshold, a communication failure may occur. For example, a distortion in the range of 30% or more may be beyond the tolerance for many signal decoding circuits and may result in a higher than desirable bit-error rate.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a duty cycle correction circuit is disclosed. The duty cycle correction circuit includes an input stage, an output stage and a feedback component including a feedback amplifier and a low pass filter. The feedback component compares and adjusts the duty cycle of a signal from an input stage to a target value via a control voltage. The input stage reduces the rise and fall times of received signal to increase the duty cycle sensitivity to a control voltage from the feedback component. The output of the output stage is coupled to the input of the feedback component and the output stage amplifiers the duty cycle adjusted signal processed by both input stage and feedback component.

In some examples, the output of the feedback component is further coupled to a capacitor, wherein the capacitor is also coupled to the first input of the output stage amplifier and the output of the feedback component is coupled to the first input of the output stage amplifier through a resistor. The input stage is coupled to supply voltage through a first input stage resistor and to ground through a second input stage resistor. The low pass filter is configured to filter noise prior to an amplification of a signal by the feedback amplifier.

The feedback amplifier is configured to extract the duty cycle of the signal from the output amplifier, which is indicated by the average value of the signal. The feedback amplifier also amplifies the difference between the signal duty cycle to a target duty cycle by subtracting a signal received at the output of the output stage amplifier from the reference voltage and amplifying the subtracted signal according to a predefined DC gain of the feedback amplifier.

In some examples, the reference voltage is equal of one half of supply voltage, if the target duty cycle is 50%. The reference voltage could be other values according to a desired duty cycle.

In some embodiments, the low pass filter includes a resistor and a capacitor. In other embodiments, the low pass filter may also include an inductive component in addition to or in place of the capacitor.

In another example, a duty cycle correction circuit is disclosed. The duty cycle correction circuit includes an input stage to reduce rise time or fall time of an input signal, an output stage amplifier to amplify an output signal from the input stage to a preselected voltage swing and a target common voltage, and a feedback component including a feedback amplifier and a low pass filter to filter noise and to correct duty cycle of the signal from an output of the output stage amplifier.

The output of the output stage amplifier is coupled to the first input of the feedback component and the output of the feedback component is inputted to the first input of the output stage amplifier and to an output of an input stage. The second input of the output stage amplifier is coupled to a fix reference voltage. The second input of the feedback component is coupled to a fix reference voltage. The output of the feedback component is further coupled to a capacitor. The capacitor is also coupled to the first input of the output stage amplifier. The output of the feedback component is coupled to the first input of the output stage amplifier through a resistor. The input stage is coupled to supply voltage through a first input stage resistor. The input stage is coupled to ground through a second input stage resistor.

The low pass filter is configured to filter noise prior to an amplification of a signal by the feedback amplifier. The feedback amplifier is configured to subtract a signal received at the output of the output stage amplifier from the reference voltage and amplify the subtracted signal according to a predefined DC gain of the feedback amplifier. The input stage is configured to change the rise and fall times through the first input stage resistor and the second input stage resistor. In some examples, the reference voltage is equal of one half of supply voltage. In some other examples, the reference voltage inputted to the feedback component may be different from the reference voltage inputted to the output stage amplifier.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

The embodiments described herein describe a duty cycle correction circuit for USB Type-C BMC (Biphase Mark Coding) communication for example only. A person skilled in the art would appreciate that the embodiments described herein may also apply to other coding mechanisms. In addition, the embodiments described herein may also be used to correct duty cycle of a low frequency clock signal (e.g., less than 10 MHz).

Duty cycle of USB Type-C BMC signal can be distorted, due to ground shift or noise coupling during the transmission of data. To ensure the quality of communication, the duty cycle of the signal should be corrected. The embodiments of duty cycle correction circuit described herein monitor the average value of the received signal, as the average of the signal is proportional to the duty cycle and signal with 50% duty cycle has an average of exact half the power supply voltage. The difference of the average to half the power supply voltage is filtered and amplified then inputted as a feedbacked to a voltage controlled duty cycle block to adjust the signal duty cycle.

Figure 1:
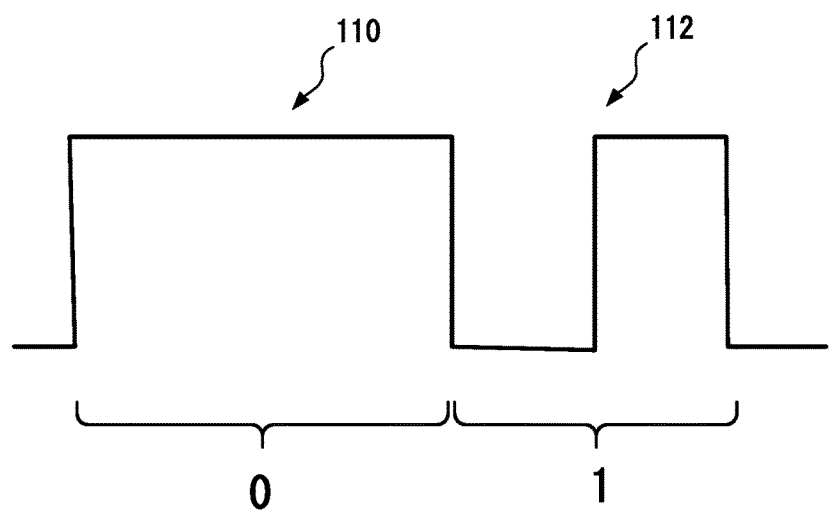
FIG. 1 shows a signal showing 0 and 1 representations.
Figure 2:
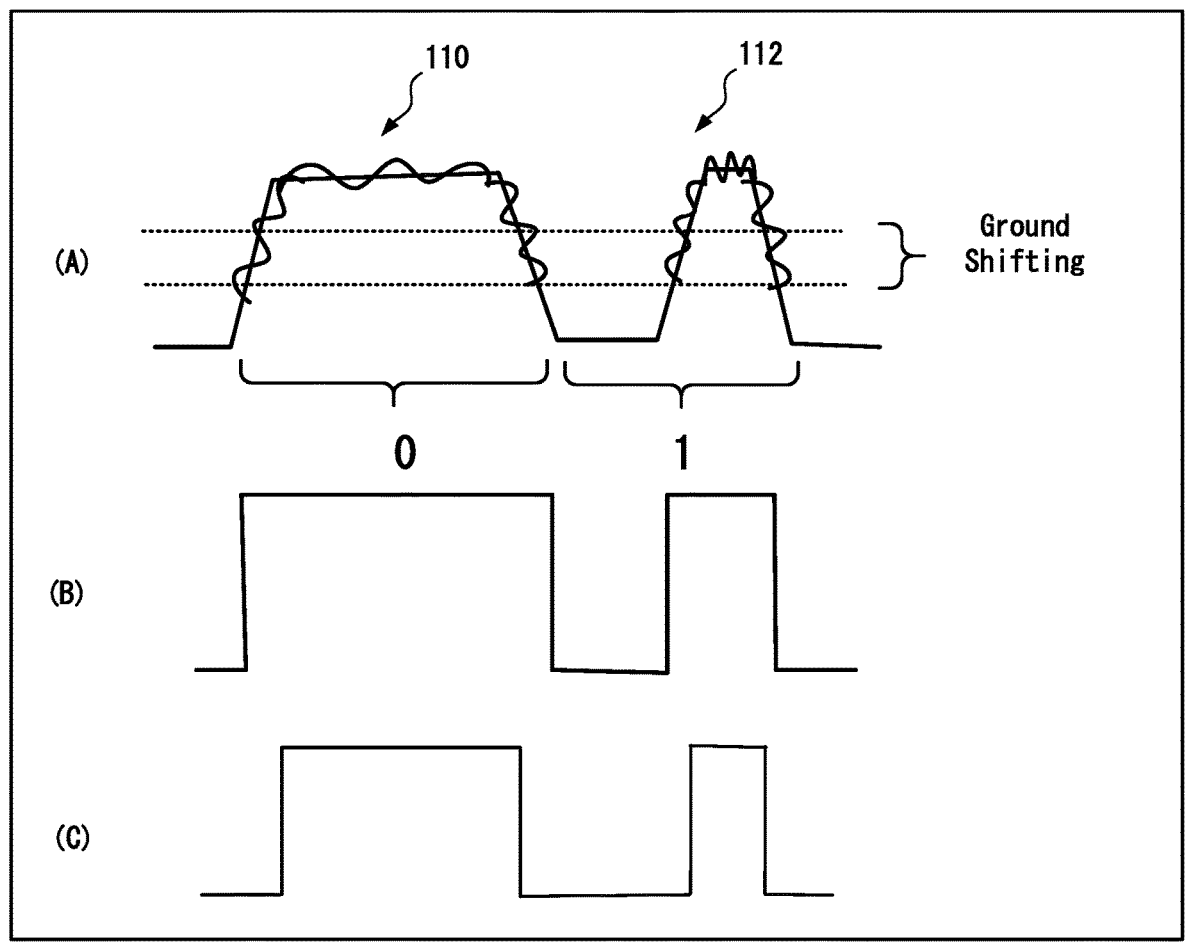
FIG. 2 shows the signal of FIG. 1 with distortions and ground shifting.

FIG. 1 shows a digital signal indicating representations of "0" 110 and "1" 112 in ideal conditions. FIG. 2, graph A, shows the same signal that is distortion due to noise and other factors such as ground shifting. Graph B shows a filtered and buffered signal without ground shifting and Graph C shows the same signal when there is a common mode voltage down-shift due to a ground shifting. As shown in FIG. 2, not only a noise is imposed on the signal but also the duty cycle is less than the original signal shown in FIG. 1 and in Graph B of FIG. 2. Example for distortion in the opposite direction is not shown but a person skilled in the art will understand that the same can be observed by changing the noise and ground shifting polarities.

Figure 3:
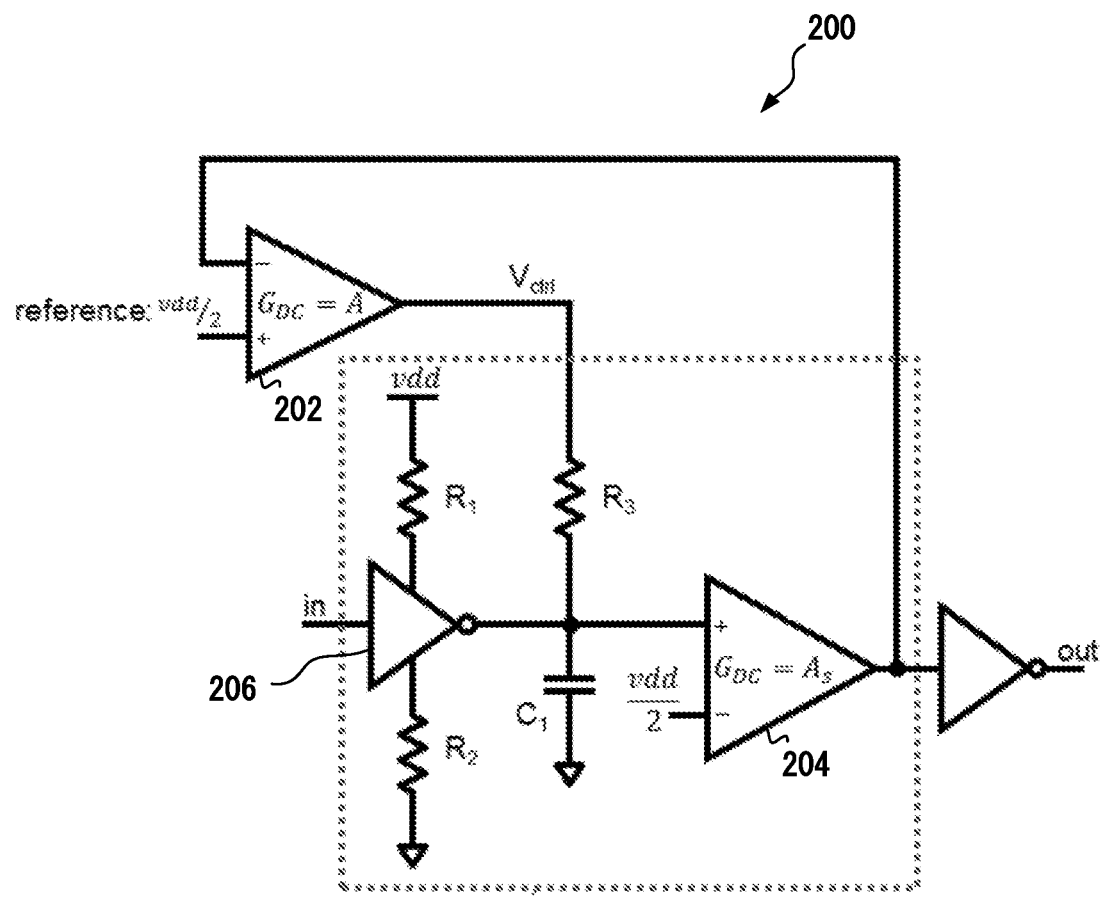
FIG. 3 shows a block diagram of a distortion correction circuit in accordance with one or more embodiments.

FIG. 3 shows a duty cycle correction circuit 200 to correct the duty cycle of the signal consisting of the "0" 110 and "1" 112. The duty cycle correction circuit 200 includes an output stage amplifier 204 having a DC gain $A_s$ and a feedback amplifier 202 having DC gain A. The feedback amplifier 202 may also include a low pass filter (not shown). An input stage 206 is a signal rise/fall limiting stage. It reduces the rise and fall times of its received signal. In some examples, the input stage 206 may be an inverter coupled to resistors $R_1$ and $R_2$ (as shown in FIG. 3). The purpose of $R_1$ and $R_2$ is to slow down the rise time of the input signal received at the input stage 206. In some other examples, the input stage 206 may be an inverter with weak pull-up and pull-down without the resistors $R_1$ and $R_2$. The output of the input stage 206 is coupled to a capacitor $C_1$ and through a resistor $R_3$ to the output of the feedback amplifier 202. As mentioned, the feedback amplifier 202 senses the duty cycle of the output signal of the output amplifier 204 and amplifies the duty cycle difference to a target duty cycle by a defined DC gain. The first input port of the feedback amplifier 202 is coupled to a reference voltage. The reference voltage in this example is one half of the supply voltage ($V_{dd}/2$). The second input port of the feedback amplifier 202 is coupled to the output of the output stage amplifier 204. The feedback amplifier 202 produces a signal $V_{ctrl}$ based on the difference between the reference voltage and the average output of the output stage amplifier 204. The value of $V_{ctrl}$ will be higher when the voltage difference at the two input ports of the feedback amplifier 202 is higher, that is, if the reference voltage is higher than the output of the output stage amplifier 204. Higher $V_{ctrl}$ causes the pulse at the output of the input stage 206 to rise faster, thus increasing average value of the signal at the output of the input stage 206 and thereby increasing the duty cycle of the signal. This improved duty cycle signal is inputted to the first input port of the output stage amplifier 204. The purpose of the output stage amplifier 204 is to amplifier the received signal to a desired voltage swing and/or common mode voltage. The common mode voltage is added as the reference voltage ($V_{dd}/2$), which is inputted to the second input port of the output stage amplifier 204. The output stage amplifier 204 and the feedback amplifier 202 works in a feedback loop so that the average value of the output signal at the output of the output stage amplifier increases and is maintained close to $V_{dd}/2$. In some examples, reference voltages to amplifiers 202 and 204 could be different from $V_{dd}/2$ depending on a desired target common voltage and duty cycle.

The low pass filter may be a part of the feedback amplifier 202 in some embodiments. However, in some other embodiments, the low pass filter may be included prior to the feedback amplifier 202. The noise filtering improves the extraction of the average value of the signal. The filtering also suppresses the ripple or fluctuations in the sensed average value. The filtering reduces the sensed noise and improves the accuracy of the duty cycle correction. However, the filtering may increase the time the circuit needs to correct the duty cycle. The values of $R_1$, $R_2$, $R_3$ and $C_2$ may be adjusted to achieve desirable rise/fall timings to correct the duty cycle. $V_{ctrl}$ through $R_3$ changes the average value of the voltage at C1, thus the duty cycle of the signal is adjusted according to the voltage at $C_1$.

Figure 4:
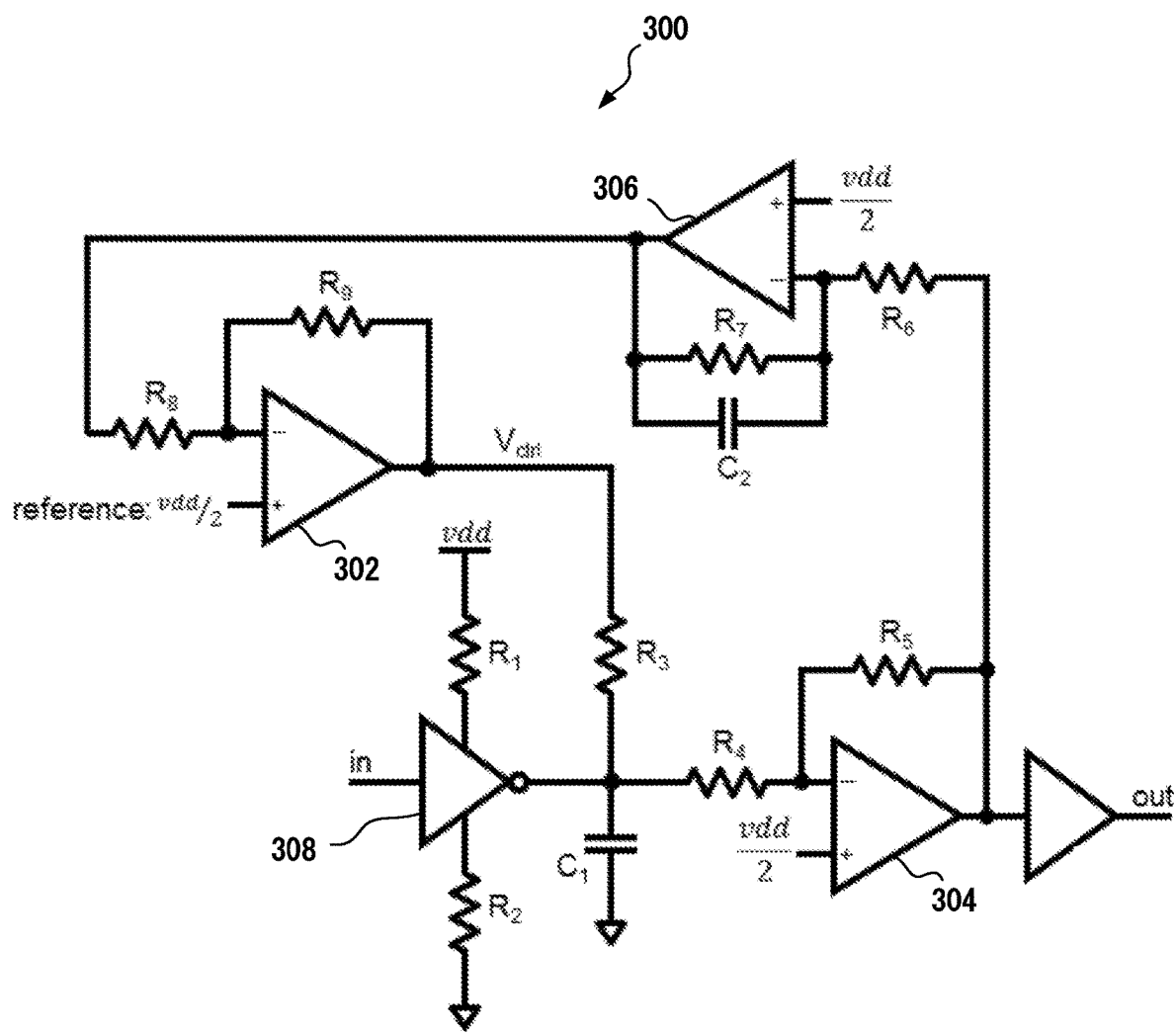
FIG. 4 shows a block diagram of the distortion correction circuit of FIG. 3 in more details in accordance with one or more embodiments.

FIG. 4 shows the duty cycle correction circuit 300 in another embodiment. The duty cycle correction circuit 300 includes a filter block that includes resistors $R_6$ and $R_7$ and a capacitor $C_2$ coupled to a filter amplifier 306. In some examples, the filter may include a reactive component. The filter block provides noise filtering and a gain. Resistors $R_4$ and $R_5$ are included to control the gain of the output stage amplifier 304. Resistors $R_1$, $R_2$, $R_3$ and the capacitor $C_1$ function as described in FIG. 3. Resistors $R_5$ and $R_9$ are provided to control the gain of the feedback amplifier 302. The total DC gain of the feedback loop includes the gain of the filter amplifier 306 and the gain of the feedback amplifier 302. This overall gain distribution into two stages is advantageous because to have one amplifier with a large gain would require a larger resistor, which takes more space on the silicon.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A duty cycle correction circuit, comprising:
   an input stage to reduce rise time or fall time of an input signal;
   an output stage amplifier to amplify an output signal from the input stage to a preselected voltage swing and a target common voltage, wherein an input of the output stage is coupled to a fix voltage reference; and
   a feedback component including a feedback amplifier and a low pass filter to filter noise and to correct duty cycle of the signal from an output of the output stage amplifier.

2. The duty cycle correction circuit of claim 1, wherein an output of the output stage amplifier is coupled to a first input of the feedback component and an output of the feedback component is inputted to a second input of the output stage amplifier and to an output of an input stage.

3. The duty cycle correction circuit of claim 2, wherein a second input of the feedback component is coupled to a second fix reference voltage.

4. The duty cycle correction circuit of claim 2, wherein the output of the feedback component is further coupled to a capacitor, wherein the capacitor is also coupled to the second first input of the output stage amplifier.

5. The duty cycle correction circuit of claim 2, wherein the output of the feedback component is coupled to the second input of the output stage amplifier through a resistor.

6. The duty cycle correction circuit of claim 1, wherein the input stage is coupled to supply voltage through a first input stage resistor.

7. The duty cycle correction circuit of claim 6, wherein the input stage is coupled to ground through a second input stage resistor.

8. The duty cycle correction circuit of claim 7, wherein the input stage is configured to change the rise and fall times through the first input stage resistor and the second input stage resistor.

9. The duty cycle correction circuit of claim 1, wherein the low pass filter is configured to filter noise prior to an amplification of a signal by the feedback amplifier.

10. The duty cycle correction circuit of claim 1, wherein the feedback amplifier is configured to subtract a signal received at the output of the output stage amplifier from a second fix reference voltage and amplify the subtracted signal according to a predefined DC gain of the feedback amplifier.

11. The duty cycle correction circuit of claim 1, wherein the fix reference voltage is equal of one half of supply voltage.

12. The duty cycle correction circuit of claim 1, wherein the low pass filter includes a resistor and a capacitor.

13. A duty cycle correction circuit, comprising:
    an input stage to reduce rise time or fall time of an input signal;
    an output stage amplifier to amplify an output signal from the input stage to a preselected voltage swing and a target common voltage; and
    a feedback component including a feedback amplifier and a low pass filter to filter noise and to correct duty cycle of the signal from an output of the output stage amplifier, wherein the low pass filter includes a resistor and a capacitor.

14. A duty cycle correction circuit, comprising:
    an input stage to reduce rise time or fall time of an input signal;
    an output stage amplifier to amplify an output signal from the input stage to a preselected voltage swing and a target common voltage; and
    a feedback component including a feedback amplifier and a low pass filter to filter noise and to correct duty cycle of the signal from an output of the output stage amplifier, wherein the low pass filter includes a resistor and a capacitor, wherein an output of the output stage amplifier is coupled to a first input of the feedback component and an output of the feedback component is inputted to a first input of the output stage amplifier and to an output of an input stage and a second input of the output stage amplifier is coupled to a fix reference voltage.

* * * * *